(12) United States Patent
Williams

(10) Patent No.: US 6,433,552 B1
(45) Date of Patent: Aug. 13, 2002

(54) FLOATING PLATE VOLTAGE MONITOR

(76) Inventor: Bruce T. Williams, 54 Jesson Pkwy., Lockport, NY (US) 14094

(*) Notice: Subject to any disclaimer, the term of this patent is extended or adjusted under 35 U.S.C. 154(b) by 0 days.

(21) Appl. No.: 09/556,922

(22) Filed: Apr. 21, 2000

Related U.S. Application Data

(60) Provisional application No. 60/130,331, filed on Apr. 21, 1999.

(51) Int. Cl.$^7$ ............................................... G01R 29/12
(52) U.S. Cl. ........................ 324/458; 324/455; 361/231
(58) Field of Search ................................. 324/457, 458, 324/459, 455, 464, 452, 470; 361/213, 230, 231, 229, 235; 55/105

(56) References Cited

U.S. PATENT DOCUMENTS

| | | | |
|---|---|---|---|
| 4,433,297 A | * | 2/1984 | Buchheit |
| 4,740,862 A | * | 4/1988 | Halleck |
| 4,809,127 A | * | 2/1989 | Steinman |
| 5,016,136 A | * | 5/1991 | Corris |
| 5,506,507 A | * | 4/1996 | Schwierzke |
| 6,130,815 A | * | 10/2000 | Pitel |

* cited by examiner

Primary Examiner—Michael J. Sherry
Assistant Examiner—Trung Nguyen
(74) Attorney, Agent, or Firm—Hodges Russ LLP

(57) ABSTRACT

A floating plate ion monitoring system and method wherein an ion collector assembly comprises an ion conducting surface and shielding surface in spaced relation, the ion conducting surface being located to receive ion impingement thereon, and wherein a potential is applied to the shielding surface which duplicates and follows the voltage appearing on the ion conducting surface. As a result, the capacitance between the ion conducting surface and the shielding surface is established electrically and independent of the physical configuration of the ion collector assembly. The foregoing is accomplished by providing a unity gain connected operational amplifier and connecting the positive input thereof to the ion conducting surface and the inverting input thereof to the shielding surface. An indicator connected to the amplifier output monitors the voltage on the ion conducting surface. A voltage reference is applied to the electrically established capacitance so that the voltage rating thereof need not be equal to or greater than the limits of voltage appearing on the ion conducting surface. The magnitude of the applied voltage reference can be varied in a manner varying the magnitude of the electrically established capacitance.

20 Claims, 12 Drawing Sheets

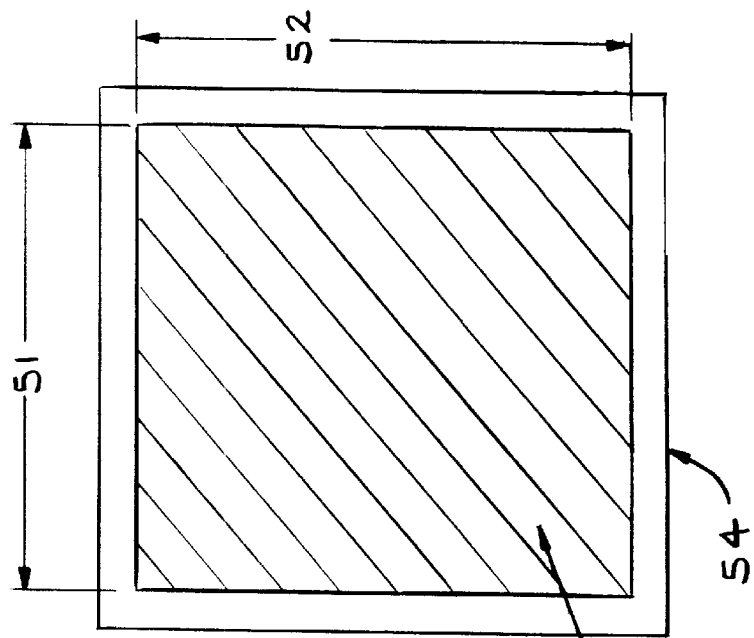
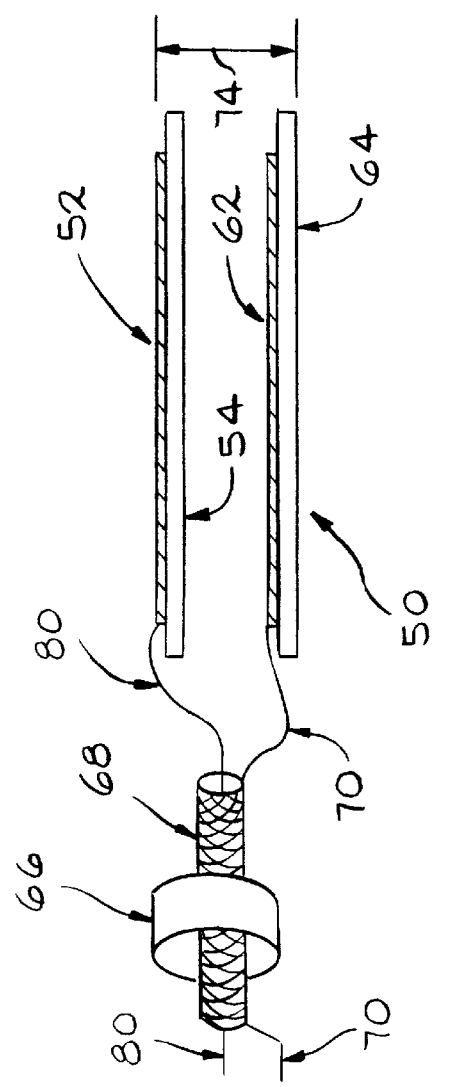
FIG. 3B
FIG. 3A

FLOATING PLATE VOLTAGE MONITOR

CROSS REFERENCE TO A RELATED APPLICATION

Applicant claims priority on Provisional Application No. 60/130,331 filed Apr. 21, 1999 and entitled "Floating Plate Voltage Monitor" which is incorporated herein by reference.

BACKGROUND OF INVENTION

This invention relates the art of electrical measurements, and more particularly to an electrical measuring method and apparatus which provides for the voltage measurement and pre-charging of an isolated and/or remote surface or structure such as the ion collecting plate element of a floating plate ion monitoring system.

Floating plate ion monitoring systems are typically used to measure the effectiveness and efficiency of room air ionization systems employed in the semiconductor manufacturing process industry to reduce or eliminate charge accumulation on charge sensitive semiconductor or LCD (liquid crystal devices) during the manufacturing process.

As conventionally known, charge accumulation on charge sensitive semiconductor elements such as mosfet gates arrays, digital memory or logic elements, or LCD devices using TFT device (thin film transistors), if not controlled or eliminated will cause immediate destruction or early life field failure of the semiconductor junctions of these devices.

Air ions, both positive and negative, are typically used to flood areas where semiconductor devices are being processed to provide a pool of mobile air ion charges which can be attracted by the undesirable charges associated with the semiconductor devices under process to effectively cancel them to zero net charge.

The typical floating plate ion monitoring system plays an important role in the air ion control system by providing a means of measuring the quantity of mobile air ions of each polarity being produced by an air ionization system, as well as providing a measure of the ability of the produced air ion field to hold various spatial areas associated with the semiconductor process line at a zero or near zero voltage level.

In use, the typical floating plate monitoring system provides two modes of operation, a "decay" mode and a "float" mode. In the decay mode the ion collecting plate or surface associated with the monitor is pre-charged to a positive or negative voltage level of typically 1000 volts or more. The time required for the collecting plate to be discharged to a level of 10% of the starting value, i.e. 100 volts, by ion impingement from the ion field is measured by a timer in the monitor to indicate the quantity of either polarity of air ion associated with the ion field. This measurement is done with a pre-charge level of positive 1000 volts to indicate the quantity of negative air ions or with a pre-charge level of negative 1000 volts to indicate the quantity of positive air ions. In either case the time required for the plate to be discharged to a 100 volt level by the attraction of the oppositely charged air ion to the ion collecting plate is measured and used to indicate the "richness" of the particular ion in the field.

In the float mode the ion collecting plate is initially pre-set to a zero voltage level and then allowed to "float" to a voltage level dictated by the impingement of incident ions from the ion field. The float measurement indicates the effectiveness of the field in reducing the net charge on the semiconductor devices to a low value while also indicating to what voltage level all devices, even devices which were not initially charged, will be driven to by the ion field.

Floating plate monitoring systems heretofore available suffer from many disadvantages. One results from the fact that the ion collecting plate element of the monitor system, in order to be isolated from ground by a high impedance, is typically monitored by use of a non-contacting electrostatic voltmeter probe device to indicate the voltage level of the plate element in reference to ground. These electrostatic voltmeter probes, typically of the field "mill" or tuning fork chopper types, are expensive and require a large mounting space at the ion collecting plate assembly to effectively read the plate voltage.

Another disadvantage is that to pre-charge the ion collecting plate for decay mode measurements, a relay or solenoid is typically used to momentarily connect the plate to a pre-charge level voltage source. This requires a low leakage relay scheme to maintain the plate at a high impedance level relative to ground thus typically requiring the relay to be positioned at the ion collecting plate structure itself.

A further disadvantage arises from the fact that as dictated by the measurement standards, the capacitance between the ion collecting plate and its associated ground referenced structures must be held at a specified capacitance of typically 20 pf+/−10%. This requires a specific plate geometry configuration that dictates a minimum volume ion collecting plate structure. This structure is typically large, in the order of 15 cm×15 cm with a thickness of 6 to 7 cm minimum. Using this type structure, it is not possible to position the ion collecting plate structure directly on line with the semiconductor devices for direct measurement of the effectiveness of the ion field at the location of the semiconductor devices themselves, therefore reducing the accuracy of the measurement.

Another disadvantage is that to operate the ion collection plate assembly a large diameter connecting cable to the monitor electronic assembly is typically used to accommodate the wiring for the electrostatic probe device electronics, the HV relay device actuation wiring, the high voltage wiring for the pre-charge supply and the ground reference connection for the ground reference element. This results in a bulky ion collecting plate assembly cable which limits assembly position flexibility and easy placement of the assembly.

A further disadvantage is that whereas it is desirable to construct an ion collection plate which is of the same relative size and thickness as the semiconductor devices which are placed within the ion field, the current art ion collecting elements, due to their required size to accommodate the required relay, electrostatic probe, and required measurement capacitance, cannot be constructed in the size desired.

Another disadvantage is that to produce the required ion collecting plate capacitance relative to the ground referenced element precise manufacturing of the ion collecting plate is required while other mechanical components such as spacers to support the ion collecting plate element from the ground reference element must be of high precision, low leakage and high cost construction.

A still further disadvantage is that the bandwidth (frequency response) of current art floating plate monitoring systems is limited to approximately 40 to 50 Hz due to the use of the typical electrostatic probe system used to monitor the ion collecting plate. This is a serious limitation particularly where A.C. type air ion production equipment is employed. The A.C. type ion production equipment can induce damaging A.C. fields and voltages at the location of the semiconductor devices and cannot be accurately measured using current art type floating plate monitors.

SUMMARY OF THE INVENTION

It is, therefore, a primary object of this invention to eliminate the aforementioned disadvantages found with floating plate monitoring systems heretofore available while reducing the cost of such systems.

It is a further object of this invention to eliminate the necessity and use of the typical electrostatic voltage probe in the ion plate assembly construction.

It is a further object of this invention to eliminate the necessity and use of a high voltage relay or solenoid in the ion plate assembly construction.

It is a further object of this invention to eliminate the requirement of providing an ion collecting plate structure which is dependent upon mechanical considerations such as plate area and plate spacing, both relative to the ground reference structure, to establish the specified ion plate capacitance to the ground reference, but to establish the specified capacitance using electrical means.

It is a further object of this invention to reduce the connecting cable to the ion collecting plate structure to a highly flexible small diameter cable to allow easy positioning of the ion plate assembly to the areas of measurement by the use of a single conductor shielded cable.

It is a further object of this invention to provide a high bandwidth capability floating plate voltage monitoring system to allow for the detection and measurement of A.C. electrical fields which are in the vicinity of the ion collector plate.

It is a further object of this invention to provide a technique whereby an isolated surface or structure may be charged to a given voltage level during a "charge" sequence while the voltage level of the isolated surface or structure can be monitored during a "read" sequence using a single shielded conductor to the floating plate assembly to charge, discharge and monitor the ion collection surface or structure.

It is a further object of this invention to provide a technique whereby an isolated surface or structure can be shielded from extraneous electrostatic charges, voltages, or fields on as many sides of the surface or structure as desired while maintaining very low capacitive loading or resistive loading due to leakage from the ion collecting surface to the shielding electrode or by the capacitance or leakage effects of the connecting cable.

It is a further object of this invention to provide a technique which will allow the ion collector plate assembly to be operated without the use of an electrostatic probe device, a relay device, and/or a bulky cable so as to allow the assembly to be constructed in various sizes and thicknesses which are comparable to the size and thickness of various semiconductor devices which are being processed to provide for high accuracy simulation by the floating plate monitoring system of the response of the semiconductor devices to the ion field and/or A.C. field.

It is a further object of this invention to provide a floating plate monitoring system which requires low maintenance and features high reliability by eliminating the use of mechanical devices such as electrostatic probes and relays or solenoids.

The present invention provides a floating plate ion monitoring system and method wherein an ion collector assembly comprises an ion conducting surface and shielding surface in spaced relation, the ion conducting surface being located to receive ion impingement thereon, and wherein a potential is applied to the shielding surface which duplicates and follows the voltage appearing on the ion conducting surface. As a result, the capacitance between the ion conducting surface and the shielding surface is established electrically and independent of the physical configuration of the ion collector assembly. The foregoing is accomplished by providing a unity gain connected operational amplifier and connecting the positive input thereof to the ion conducting surface and the inverting input thereof to the shielding surface. An indicator connected to the amplifier output monitors the voltage on the ion conducting surface. A voltage reference is applied to the electrically established capacitance so that the voltage rating thereof need not be equal to or greater than the limits of voltage appearing on the ion conducting surface. The magnitude of the applied voltage reference can be varied in a manner varying the magnitude of the electrically established capacitance.

The foregoing and additional advantages and characterizing features of the present invention will become clearly apparent upon a reading of the ensuing detailed description together with the included drawing.

BRIEF DESCRIPTION OF THE DRAWING FIGURES

FIG. 3A is a diagrammatic view of an ion collecting plate assembly of the present invention;

FIG. 3B is a plan view of the assembly of FIG. 3A;

DETAILED DESCRIPTION OF THE ILLUSTRATED EMBODIMENTS

Figure 1:
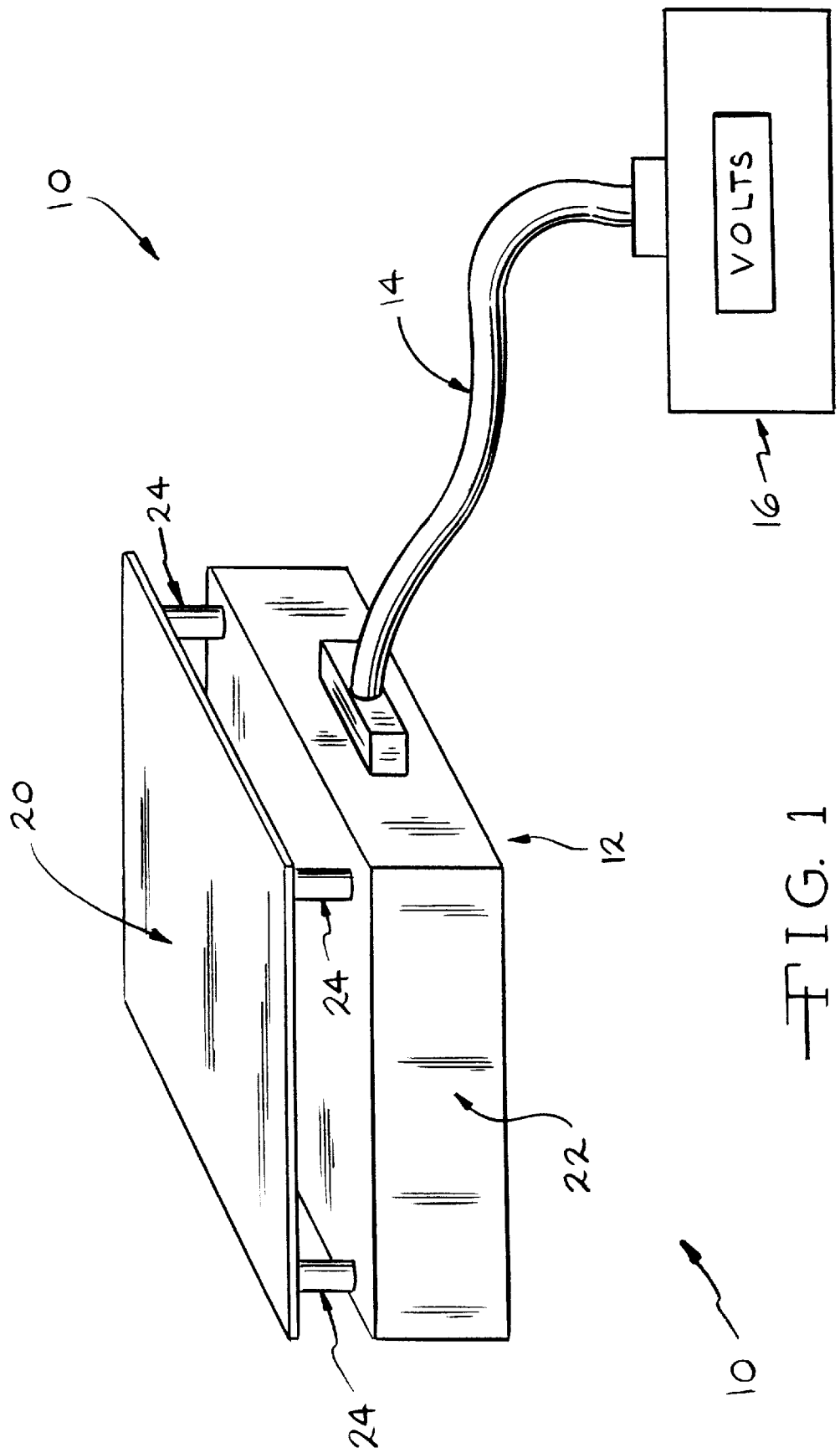
FIG. 1 is a perspective view of a prior art floating plate ion monitoring system.

Shown in FIG. 1 is a pictorial representation of a typical current art floating plate ion monitoring system 10. The ion collecting plate assembly 12 is shown connected via cable 14 to the monitor electronics assembly 16. The ion collector plate 20 typically has the dimensions of 15 cm on a side for an area 225 $cm^2$ and is spaced away from the ground referenced structure 22 by approximately 2.5 cm as established by four low leakage spacers 24 to establish a capacitance between surface 20 and ground reference structure 22 of 20 pf+/−10% as required by the measurement standard.

Figure 2:
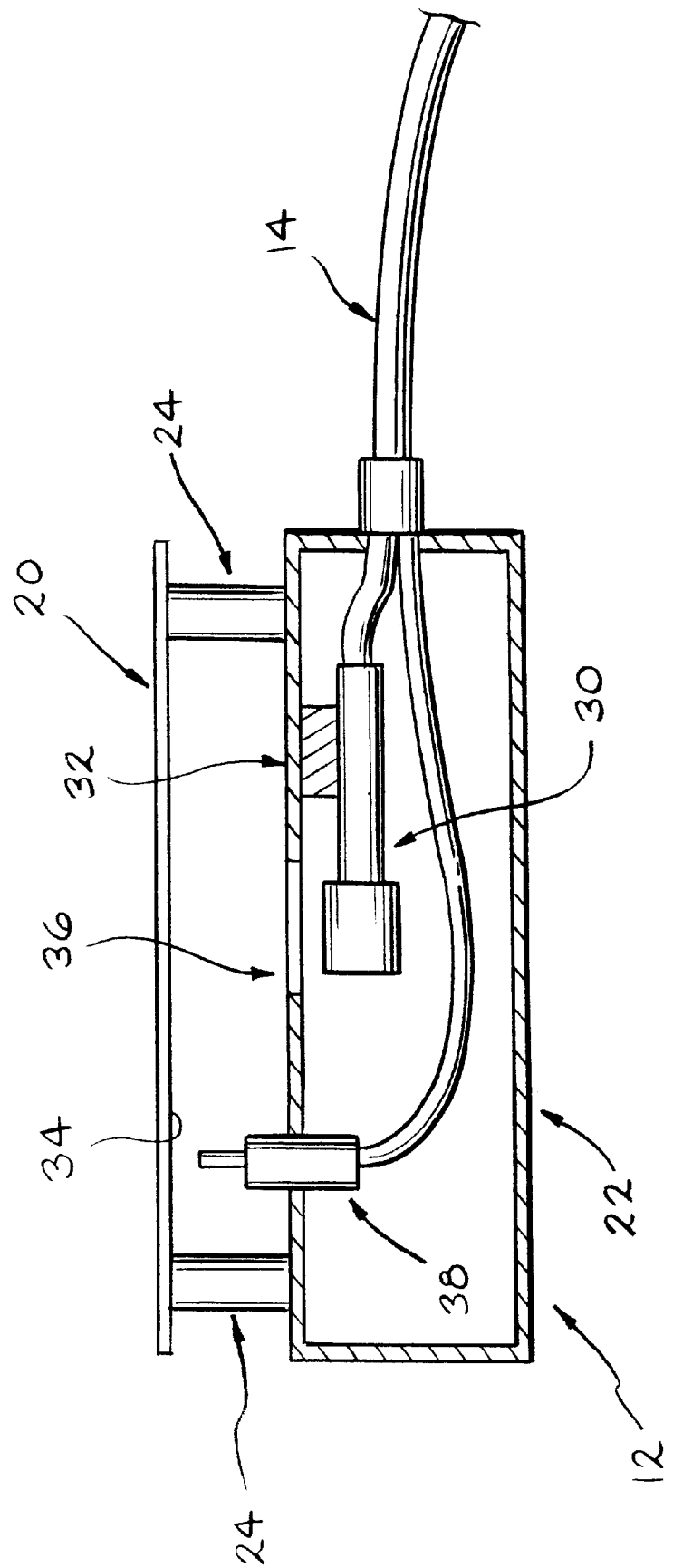
FIG. 2 is a fragmenting cross-sectional view of a portion of the system of FIG. 1.

Shown in FIG. 2 is a pictorial representation of the ion collector plate assembly 12 with the ground reference structure 22 shown in cutaway to illustrate the electrostatic probe 30 supported by mounting means 32 so as to capacitively couple probe 30 to measure the voltage of the surface 34 ion collecting plate 20, through an aperture 36. Also shown is a solenoid 38 which, when energized, makes contact to surface 34 to apply a voltage to surface 34 to pre-charge the surface for decay mode operation measurements or discharge it to zero for float mode operation.

Cable 14 contains the wiring for the electronics of probe 30 which includes the probe modulator excitation signals, the signal output and power supply connections. Cable 14 also includes wiring for the ground reference structure 22, the solenoid actuation signal, and the pre-charge bias level supply.

Shown in FIG. 3A is a schematic and pictorial representation of the ion collecting plate assembly 50 of the present invention. FIG. 3B is a plan view of the top of the assembly, i.e. the ion collection surface 52 on a supporting surface 54. The dimensions of surface 52 are shown as S1 and S2 which can be of any desired dimensions consistent with the desired application. Variations may include rectangular, circular, or any other combination of shapes or sizes. In addition, surface 52 does not have to be flat but can take various shapes such as spherical or conical. Surface 52, to perform as an ion collection surface, is preferably a conduction surface, such as metal or a semi-conducting surface with a surface and/or volume resistivity ranging up to approximately $10^8$–$10^{10}$ ohm/square. Surface 52 therefore can be provided by the use of a metal plate of flat or formed conducting material such as aluminum or brass or it may be provided by a conductive or semi-conductive film either rigid or flexible which can be bonded, deposited or evaporated onto the support surface 54, an insulating material. The term "ion conducting surface" therefore includes the various forms of surface 52. In the case where surface 52 is a rigid surface or structure, no support surface 54 is required and discreet spacers may be employed.

Assembly 50 also includes a shielding surface 62, preferably a conductive surface which functions to shield surface 52 from electrostatic influences, such as voltage, charge or fields which may attempt to couple to surface 52 from either the bottom or sides of the assembly. The size and shape of shielding surface 62 is consistent with the size and shape of surface 52 to allow surface 62 to shield surface 52 against extraneous coupling to undesired sources. Unlike the prior art ion collecting assembly, shielding surface 62 does not connect to ground reference but has a voltage applied to it which duplicates and follows the voltage appearing on the ion collecting surface 52, the purpose of which will be explained presently. As surface 52 has the capability to experience a voltage range of ±1000 volts or more, surface 62 will be driven to follow the same voltage extremes as may appear on ion collecting surface 52. Surface 62 therefore should be insulated on its bottom side to prevent arc-over to grounded or other surfaces which may come into close proximity to it. Therefore surface 64, shown in relation to surface 62, is an insulating surface, to provide the needed insulation. Insulating jacket 66 is used to cover shielded cable 68 to prevent arc-over from the cable shield 70 to grounded objects.

The thickness dimension of the ion collecting assembly 50, shown by arrow 74 in FIG. 3A, can be of any desired value to accommodate many applications. The spacing between insulating surface 54, if used, and shielding surface 62 could be dictated by the thickness of surface 54 if, for example, surface 52 and surface 62 are made by depositing or bonding a metal film on each side of surface 54. This dual sided bonded metal structure could be constructed easily using standard dual sided printed circuit board material which is inexpensive and easily obtainable. Or, if desired, two pieces of single sided printed circuit board material could be used to construct the entire assembly by using one piece of single sided printed circuit board to form insulating surface 64 and shielding surface 62 and the other piece used for insulating surface 54 and ion collecting surface 52. The two pieces could be either bonded together if very thin assemblies are required, or spaced apart relative to each other by discreet spacers or other insulating material if thicker assemblies are desired.

Normally assemblies made by these low cost techniques would produce a large range of capacitances between the ion collecting surface 52 and shielding surface 62 as well as producing various degrees of resistive loading of surface 52 due to the leakage resistance of the dielectric material used for insulating surface 54, or in the case of using discreet spacers, the leakage characteristic of the spacers. In addition, the capacitance between the center conductor 80 of shielded cable 68 and its' shield 70 would be highly variable due to length variations of the cable. Cable insulation resistance between the conductor 80 and shield 70 would also be highly dependent on cable length and the type of insulation material used.

A primary objective of the present invention is to eliminate the effect of the physical configuration of the ion collecting plate assembly 50 on the capacitance between ion collecting surface 52 and shielding surface 62 as well as the capacitive loading effect of the connecting cable 68. The connection of the ion collecting plate assembly 50 of this invention via a cable 68 into the apparatus shown schematically in FIG. 4 will accomplish this objective.

Figure 4:
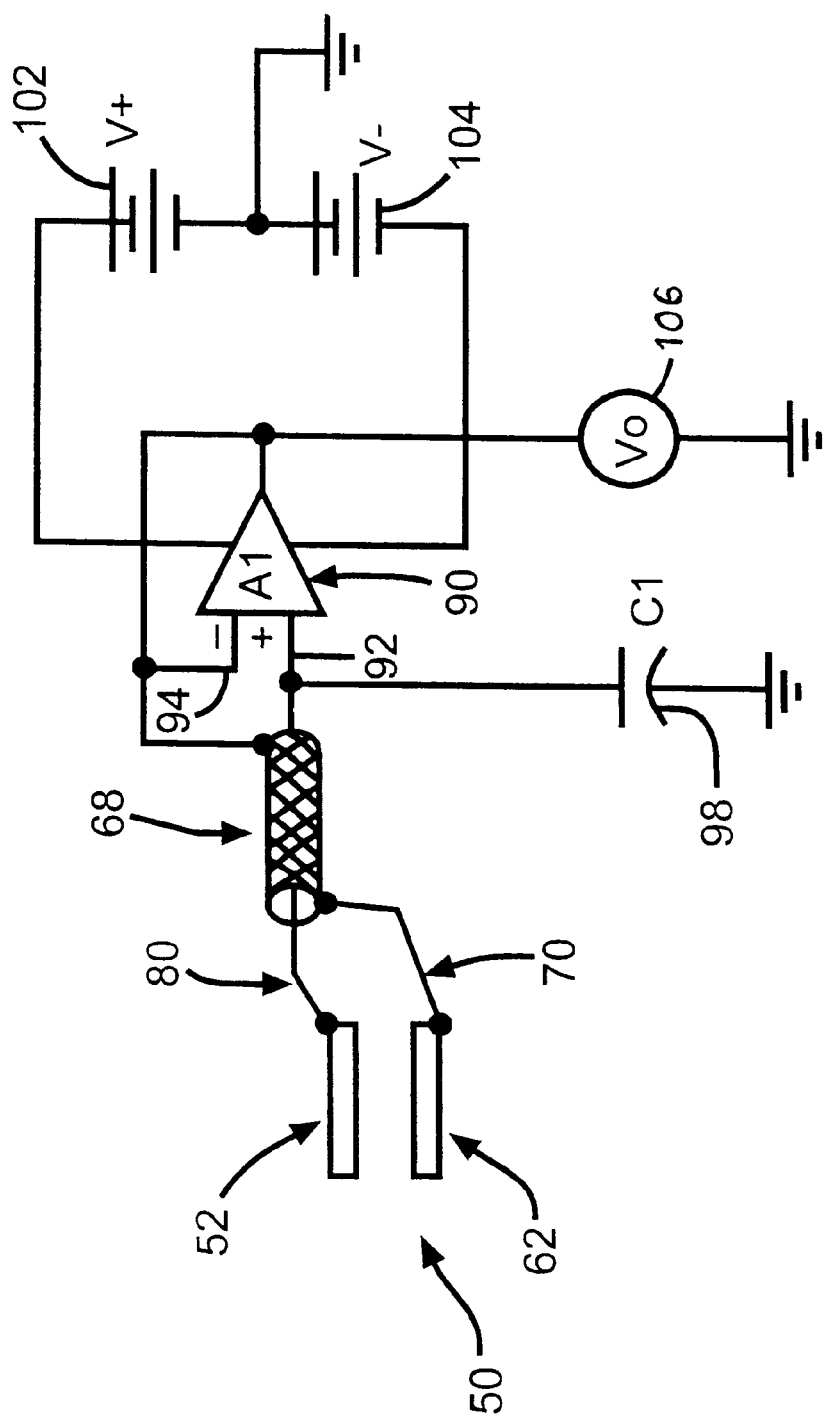
FIG. 4 is a schematic diagram of the floating plate monitor of the present invention.

Referring now to FIG. 4, there is a simplified representation of the ion collecting plate assembly 50 including the ion collecting surface 52 and the shielding surface 62 connected to a unity gain connected, i.e. buffer, operational amplifier 90. In particular, surface 52 is connected via the center conductor 80 of the shielded cable 68 to the input terminal 92, also designated (+) of amplifier/buffer 90. The shielding surface 62 and the shield of cable 70 are connected to the output and inverting input 94, also designated (−) of the amplifier/buffer 90. As conventionally known, the output of amplifier 90 will be a voltage which will follow closely the voltage applied to the input 92 (+) with a gain which approaches unity (i.e. 0.99999). Due to the connection of the shielding surface 62 and the shield 70 of cable 68 to a voltage source which follows the voltage applied to the ion collecting surface 52, no voltage difference can appear between surface 52 and surface 62 or between connection 80, the cable center conductor, and connection 70, the cable shield, for any voltage applied to surface 52 which is within the linear operating voltage range of amplifier/buffer 90. Thus, the physical capacitance existing between surface 52 and surface 62 as well as the physical capacitance between the center conductor 80 of cable 68 and its shield 79 will be electrically driven to close to zero capacitance.

For example, suppose for a particular physical geometry of the ion plate assembly 50 chosen for a particular application, the capacitance between surface 52 and surface 62 is 100 picofarads, while the capacitance of cable 68 between its center conductor 80 and its shield 70, being nominally 25 picofarads per foot and, for example, for a 10 foot length of cable being 250 picofarads, the total physical capacitance would be 350 picofarads. Upon connection of this assembly/cable into the circuit of amplifier/buffer 90, the capacitance would be reduced to: CD=Cp(1−A) where CD is the operating value of capacitance, Cp is the physical capacitance, and A is the gain of the amplifier/buffer 90. The operating capacitance would then be:

$$CD=(350)(1-0.9999) \times 10-12 = 350 \times 10^{-17} \text{ farads or } 350 \times 10^{-5} \text{ picofarads}$$

This leaves the value of C1, also designated 98 in FIG. 4, as the dominant capacitance of the system which is chosen to be a value such as 20 pf±10%. The error due to the operating capacitance on the value of C1 is less than 0.002%. As C1 is connected between ion collecting surface 52 and ground reference, a capacitance of 20 pf±10% now exists between surface 52 and ground reference as required by the measurement standard.

Similarly, the resistive leakage current between the ion collecting surface 52 and the shielding surface 62 and the resistive leakage current between the center conductor 80 and the shield 70 of shielded cable 68 are both driven to a very low value due to the zero voltage difference therebetween. Therefore, the use of expensive low leakage insulation material for insulating surface 54 and/or insulating spacers, if used, or cable dielectric material, is not required.

It easily can be seen that for any physical geometry changes associated with the ion collecting plate assembly 50, which may be dictated by various measurement applications, the sum (Cp) of the physical capacitances of the assembly and cable (Cp) has a very small, negligible effect on the capacitance as established by C1. Therefore, C1 sets the capacitance of the ion collecting surface 52 to ground by electrical means and makes the mechanical capacitance of the ion collecting plate assembly (and the cable capacitance) negligible, which is an objective of this invention.

The circuit of FIG. 4 also includes bias voltage sources 102 and 104 connected to amplifier 90 and an indicator, such as a voltmeter 106, connected between the output of amplifier 90 and ground.

The voltage-follower technique of the present invention provides virtually infinite impedance loading of the ion collecting plate assembly 50 while allowing the plate to be charged and monitored through the same small diameter cable. Therefore, the size and shape of the ion conducting plate assembly 50 and its capacitance to ground may be tailored to a particular requirement. For example, the plate capacitance can be matched to the capacitance of a particular ESD-sensitive device, or the plate dimensions can be made to permit placement of the plate assembly 50 in a remote or restricted place.

The circuit of FIG. 4 is limited in monitoring voltages on ion collecting surface 52 to a range dictated by the voltage range capability of the amplifier/buffer 90 and is typically in the range of ±30 volts for monolithic structure amplifiers. The circuitry shown in FIG. 5 can be used to expand the ion plate voltage measurement range to cover high voltages up to the limits dictated by the capability of transistor Q1, also designated 110, with its supply voltages of V3 and V4. Other high voltage regulating schemes can also be applied such as the use of cascoded bipolar or F.E.T. devices, use of high voltage photocells, or step-up regulating switching transformers etc. to obtain voltages ranges into the kilovolt range as required. The particular voltage expanding scheme shown in FIG. 5 operates in the following manner.

The center tap of supplies V1 and V2, rather than being connected to ground reference, as shown in FIG. 4, is returned to a "driven feedback line" 120. The voltage of the driven feedback line 120, limited in the positive direction by the voltage of V3 and in the negative direction by the voltage of V4, is controlled by transistor Q1. For example, if Q1 turns fully off, the V4 supply pulls the driven feedback line 120 fully to the V4 supply through resistor 122, also designated R4. If Q1 turns fully on to a current equal to V3–V4 divided by R4, the driven feedback line 120 is pulled to the V3 supply value. Various degrees of current through Q1 cause various voltage levels of the driven feedback line 120 within the limits set by V3 and V4. An operational amplifier 128, also designated A2, compares the voltage difference between the driven feedback line 120 and the output of amplifier/buffer 90 at point A and controls the amount of current through Q1. Therefore, amplifier A2 controls the voltage level of the driven feedback line 120.

For example, if the output of amplifier/buffer 90 at point A rises above the voltage on the driven feedback line 120, the output of amplifier A2 integrates negatively to increase the emitter current of Q1 through resistor 130, also designated R3, to a value which causes the driven feedback voltage to increase to re-establish a zero voltage difference between the voltage at point A and the driven feedback line 120. This same process of nulling the voltage difference between the output voltage of amplifier/buffer 90 and the voltage of the driven feedback line 120 to zero will occur for any voltage output of amplifier/buffer 90 which is within the voltage limits established V3 and V4.

The connection of the center tap of supplies V1 and V2 to the driven feedback line 120 will provide the proper operating voltage supplies for amplifier/buffer 90 and operational amplifier A2. In this case the limits of V3 and V4 would be in the order of 500 volts each with Q1 chosen to be capable of a 1000 volt VCE stress. To obtain operation of say ±1000 volts, Q1 would be cascaded to a 2000 volts VCE stress capability and both V3 and V4 increased to 1000 volts each. The value of R4 would be in the range of 1 to 10 megohms, R3 would be selected to provide up to approximately 2 ma and would be 5 kilohms for a −10 volts output from A2. R1, C2, and R2, also designated 132, 134 and 136, respectively, are selected to provide high bandwidth with stable operation and are 10 kilohms, 1000 picofarads and 1 kilohms, respectively. Vo, the output indicator 140, could be connected to the driven feedback line 120, as shown, or to the output of amplifier/buffer 90 as previously shown in FIG. 4 due to the zero voltage between these points. As previously discussed, the voltage expanding amplifier section could take many forms including the use of high voltage optical couplers, active semiconductor devices in place of R4, etc., the circuit of FIG. 5 being one of the simplest.

Figure 5:
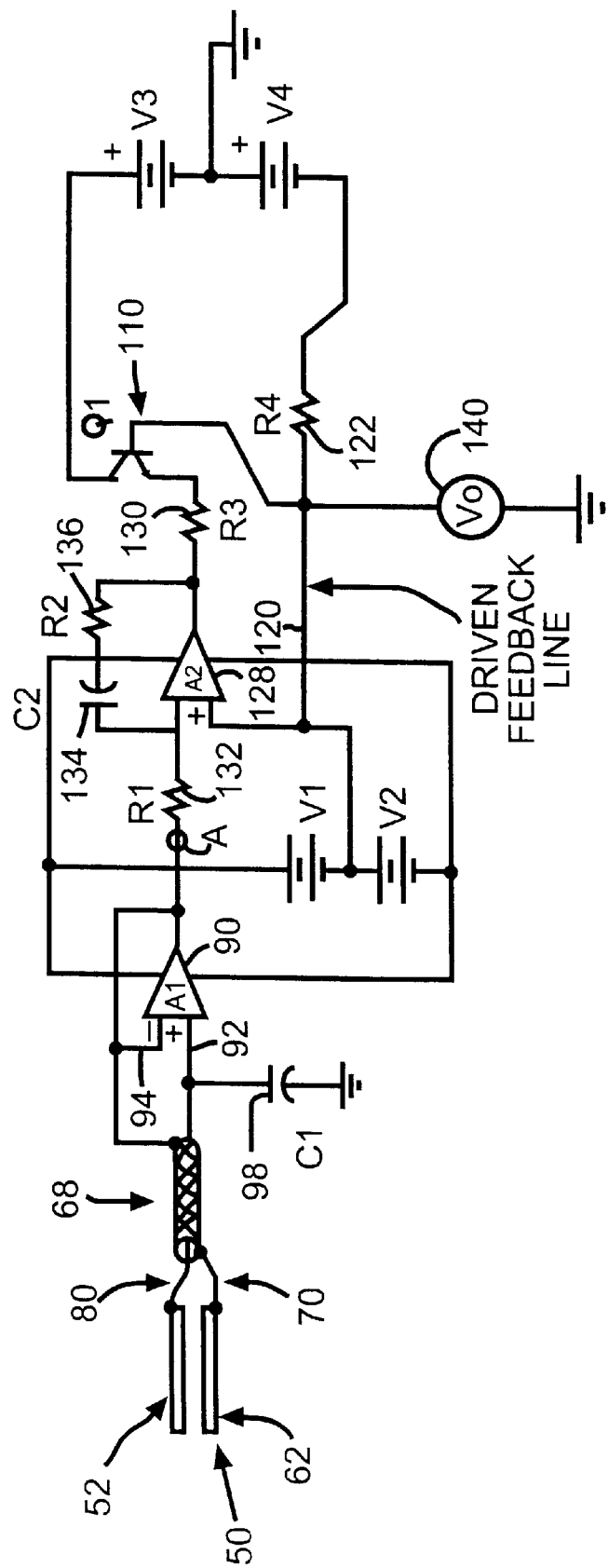
FIG. 5 is a schematic diagram of an expanded range embodiment of the monitor of FIG. 4.
Figure 6:
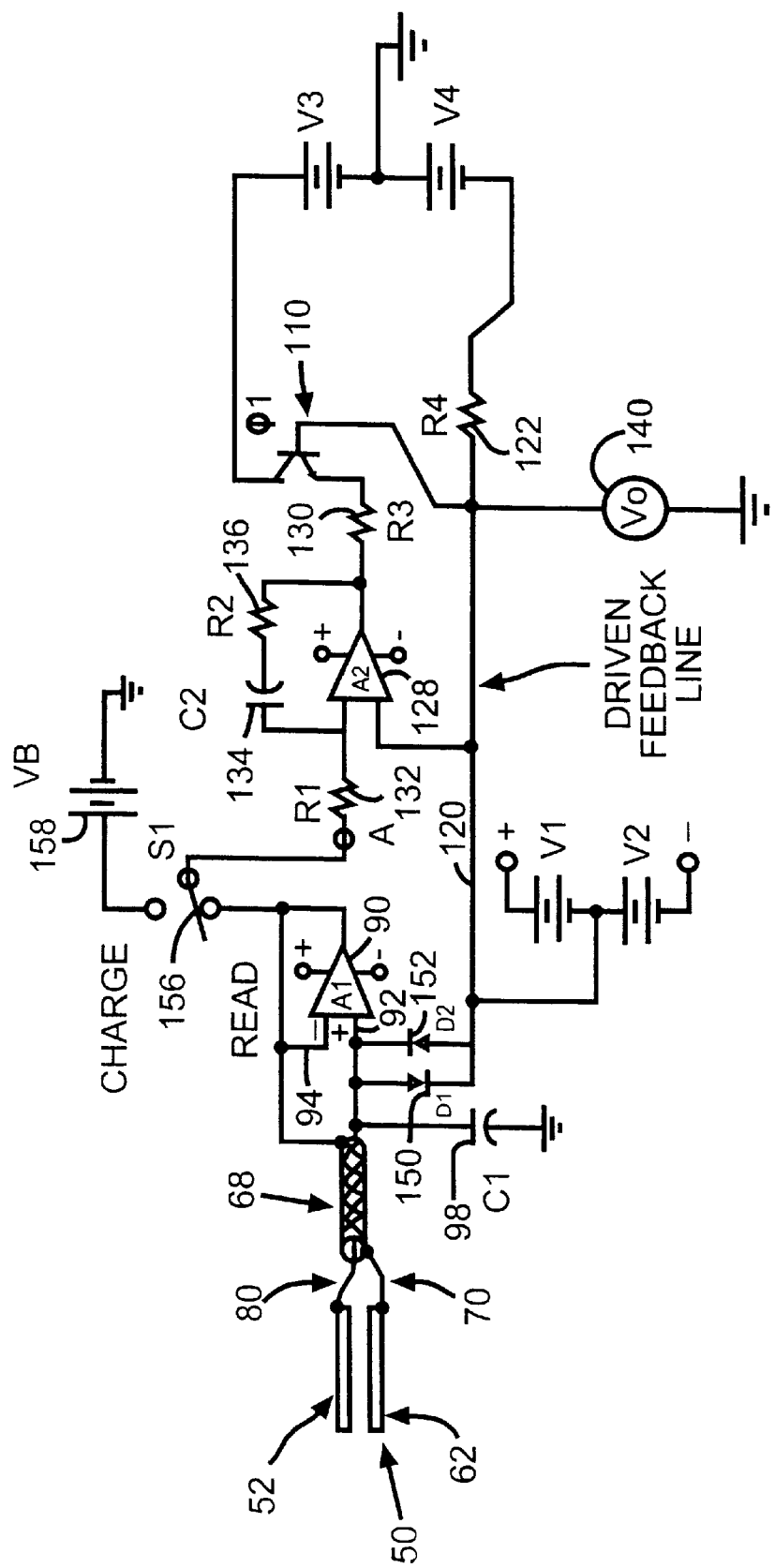
FIG. 6 is a schematic diagram of an embodiment of the monitor of the present invention for operation in the decay mode.

Shown in FIG. 6, is the circuit as shown in FIG. 5 with added elements D1, D2, S1, and $V_B$, a voltage supply. The purpose of the added components is to accomplish the objective of providing a means to eliminate the use of a relay or solenoid to change the ion collecting surface 52 to a pre-set level, say plus or minus 1 kilovolt, for operation of the monitor in the decay mode. Diodes D1 and D2, also designated 150 and 152, are low capacitance, low leakage types which will not allow the voltage difference between the input connection 92 (+input) of amplifier/buffer 90 (A1) and the driven feedback line 120 to exceed plus or minus approximately 0.5 volts.

As described in the operation of the circuit of FIG. 5, the voltage difference between the input of amplifier/buffer 90 (A1) (+) and the driven feedback line would normally be driven to zero. Therefore, for this normal operating case the diodes D1 and D2 are "transparent" and have no function in the circuit except to provide protection for the input of amplifier/buffer 90 (A1) if a voltage were applied to the ion collecting surface 52 which exceeded the linear operating voltage of the monitor as established by V3 and V4. For this over voltage situation D1 and D2 would conduct current from surface 52 into the driven feedback line to protect the input circuit of amplifier/buffer 90 (A1).

When switch S1, also designated 156, is in the "read" position the circuit of FIG. 6 is identical to the circuit of FIG. 5 except for the addition of diodes D1 and D2. However, when S1 is placed into the "charge" position, a voltage supply, $V_B$, also designated 158, is connected into the input of amplifier (A2) at point A while disconnecting the output of amplifier/buffer (A1) from the amplifier/buffer (A2) input circuit. This will cause the driven feedback line 120 to be driven to the potential of $V_B$ rather than to the potential of the output of amplifier/buffer (A1).

As the potential of the driven feedback line 120 departs from the voltage across C1, diodes D1 or D2 will forward conduct to $V_B$ cause C1 to be charged to the voltage value of $V_B$ less the forward voltage drop of D1 or D2. The connection of C1 to the ion collecting surface 52 and to the input of amplifier/buffer (A1), will cause these elements to be also pre-charged to the voltage level of $V_B$ less approximately 0.5 volts. $V_B$ may be chosen to be plus or minus any voltage within the linear voltage range of the monitor as established by V3 and V4. This accomplishes the charging of the ion collecting surface 52 without the use of relays or solenoids and it allows the surface 52 to be pre-charged through the same connection, ie (80) as is used for reading the voltage level of the surface, both being objectives of this invention.

After the precharging sequence is accomplished, switch S1 is returned to the "read" position to again monitor the output voltage of amplifier/buffer (A1) and therefore the ion collecting surface 52. If $V_B$ is equal to zero volts, the charge sequence will operate to discharge surface 52 to zero volts plus or minus 0.5 volts. If in some applications the +/−0.5 volts error from $V_B$ due to the D1 or D2 forward voltage drop cannot be tolerated, it can be eliminated by several techniques such as placing a second switch across D1 and D2 at the amplifier/buffer (A1) input terminal (+) to the driven feedback line 120 so that upon actuation of S1 into the charge mode, the second switch would short across the diodes D1 and D2 to eliminate the forward voltage drop. Switch S1 and also the second switch (if used) could be semiconductor type solid state switches rather than mechanical switches, as conventionally known.

Figure 7:
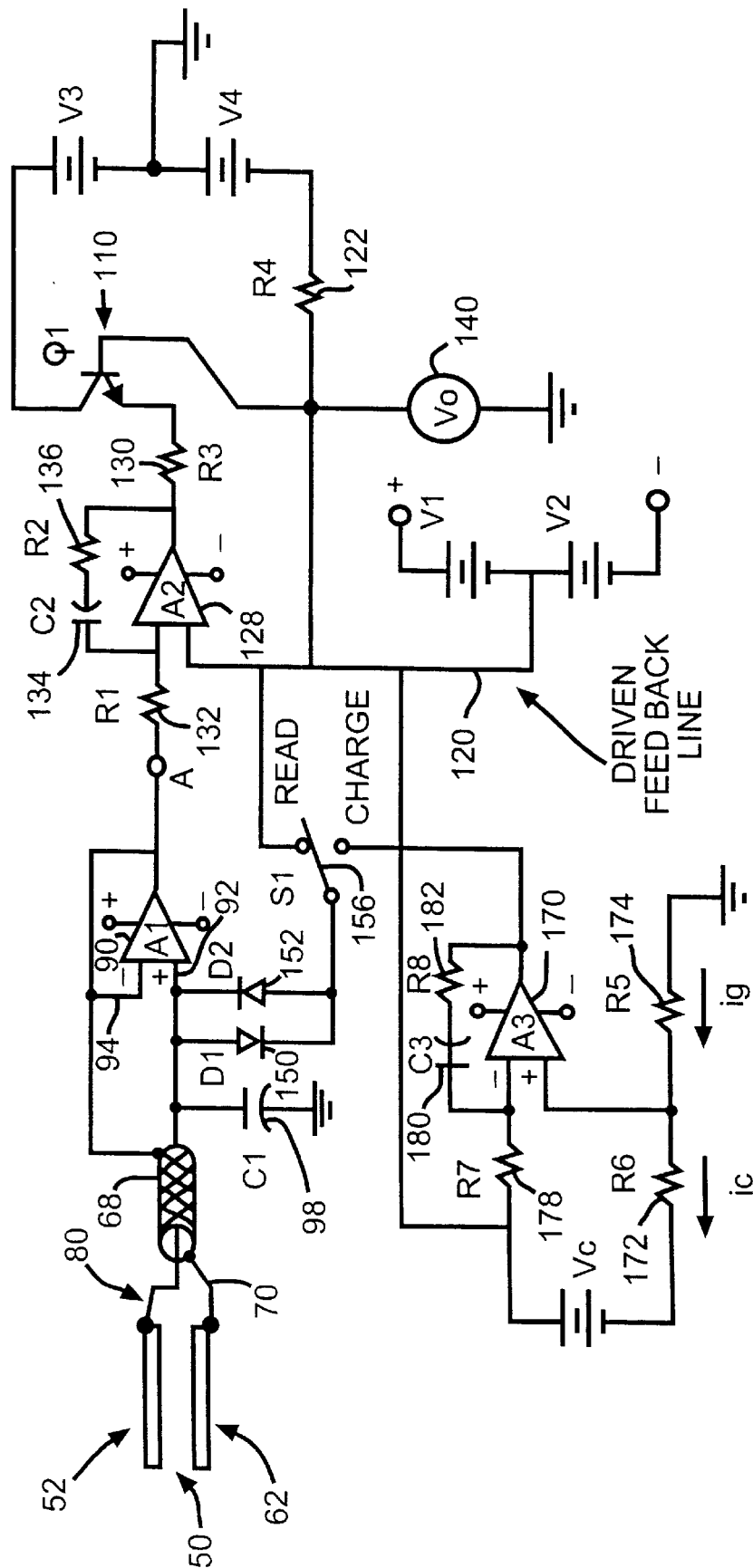
FIG. 7 is a schematic diagram of an embodiment of the monitor of the present invention which allows pre-charging or zeroing of the ion collecting surface.

Shown in FIG. 7 is another embodiment which allows the pre-charging (or zeroing) of ion collecting surface 52 through conductor 80. Using this embodiment the forward voltage drop of diodes D1 and D2 would be "inside" of a pre-charge voltage control loop and therefore would not contribute an error voltage.

In FIG. 7, an operational amplifier (A3), also designated 170, is used to compare a reference current (ic), derived from a reference voltage (Vc) through a resistance (R6), also designated 172, to a current (ig) derived from the resistance (R5), also designated 174, connected to ground reference. The resistance ratio between R6 and R5 is chosen to be a value which will allow Vc, a plus or minus voltage derived from the V1 or V2 supplies, to generate a reference current (ic) which can be matched by (ig), a ground reference current. For example if Vc is equal to −10 volts and R6 is 1 megohm, a −10 ua value of ic will appear. If the resistance ratio is 100 to 1, that is, if R5 is equal to 100 megohm, and the value of (ic) and (ig) are equal, (both 10 ua) then −1000 volts will appear across R5 in reference to ground.

The operation of the pre-charge function for this embodiment is as follows. Suppose the present value of voltage on the ion collecting surface 52 is 0 volts and we wish to charge C1 and surface 52 to −1000 volts. If Vc is at −10 volts to generate an ic value of −10 ua, the positive terminal of operational amplifier A3 will be pulled negatively in reference to the negative input terminal. This will cause the amplifier A3 output to be driven negatively. If switch S1 is now placed into the "charge" position, the negative voltage at the A3 output will forward bias diode D1 and charge capacitor C1 negatively until the voltage across R5 reaches 1000 volts to produce a voltage at the positive input of amplifier A1 at very close to zero volts. At that time the value of the output voltage of amplifier A3 will go to that value necessary to prevent any further charging of C1, ie less than 0.5 volts. Thus the diodes D1 and D2 are placed inside the voltage control loop to eliminate their voltage drop as a source of error. When S1 is then placed back into the "read" position, the reading of the voltage on surface 52 continues. The values of R7, C3, and R8, also designated 178, 180 and 182, respectively, are chosen to compensate the A3 loop to provide stable performance of the loop.

Figure 8:
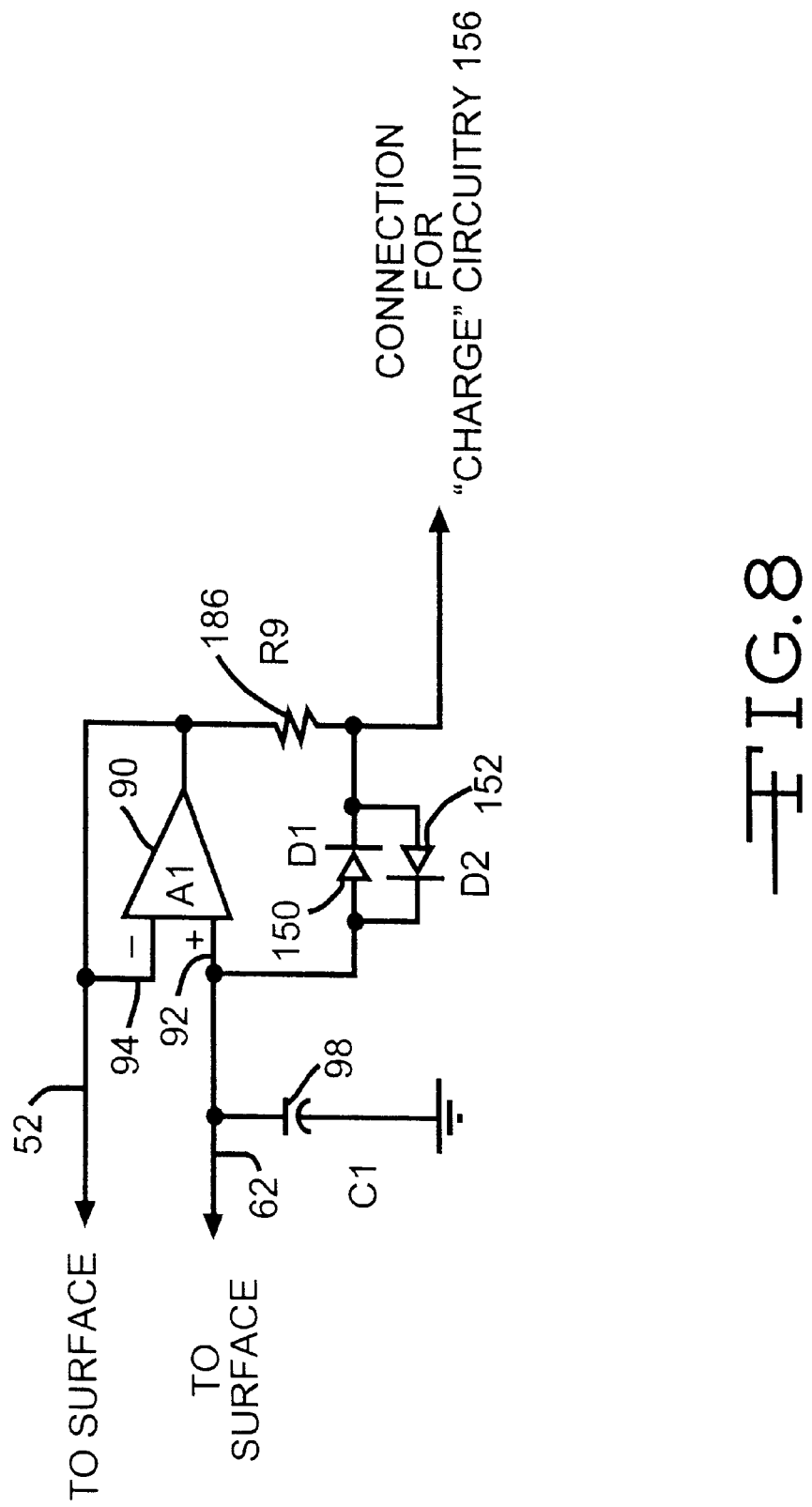
FIG. 8 is a schematic circuit diagram illustrating a modification for the monitor of FIG. 7.

To further reduce the cost of the floating plate monitoring system of this invention, as well as increase the dynamic response of the monitor, it may be desirable to return diodes D1 and D2 to the output circuit of (A1) amplifier/buffer 90 as shown in FIG. 8. In FIG. 8, a fragmentary representation, diodes D1 and D2 are returned to the output circuit of amplifier A1 via R9, also designated 186, a low value resistor of approximately 100 ohm to 1 kilohm. This will allow lower cost, higher capacitance and higher leakage type diodes to be employed over those which would be used in the connections of FIGS. 6 and 7. This benefit is obtained because the amplifier/buffer (A1) has greater bandwidth than the following high voltage enhancement amplifier A2 and transistor Q1 and therefore can keep the voltage across diodes D1 and D2 constant even in the event that a very fast voltage transition occurs on the ion collecting surface 52. The use of resistor R9 will allow the introduction of the pre-charge signals into diodes D1 and D2 without over loading the output of amplifier/buffer (A1).

Figure 9A:
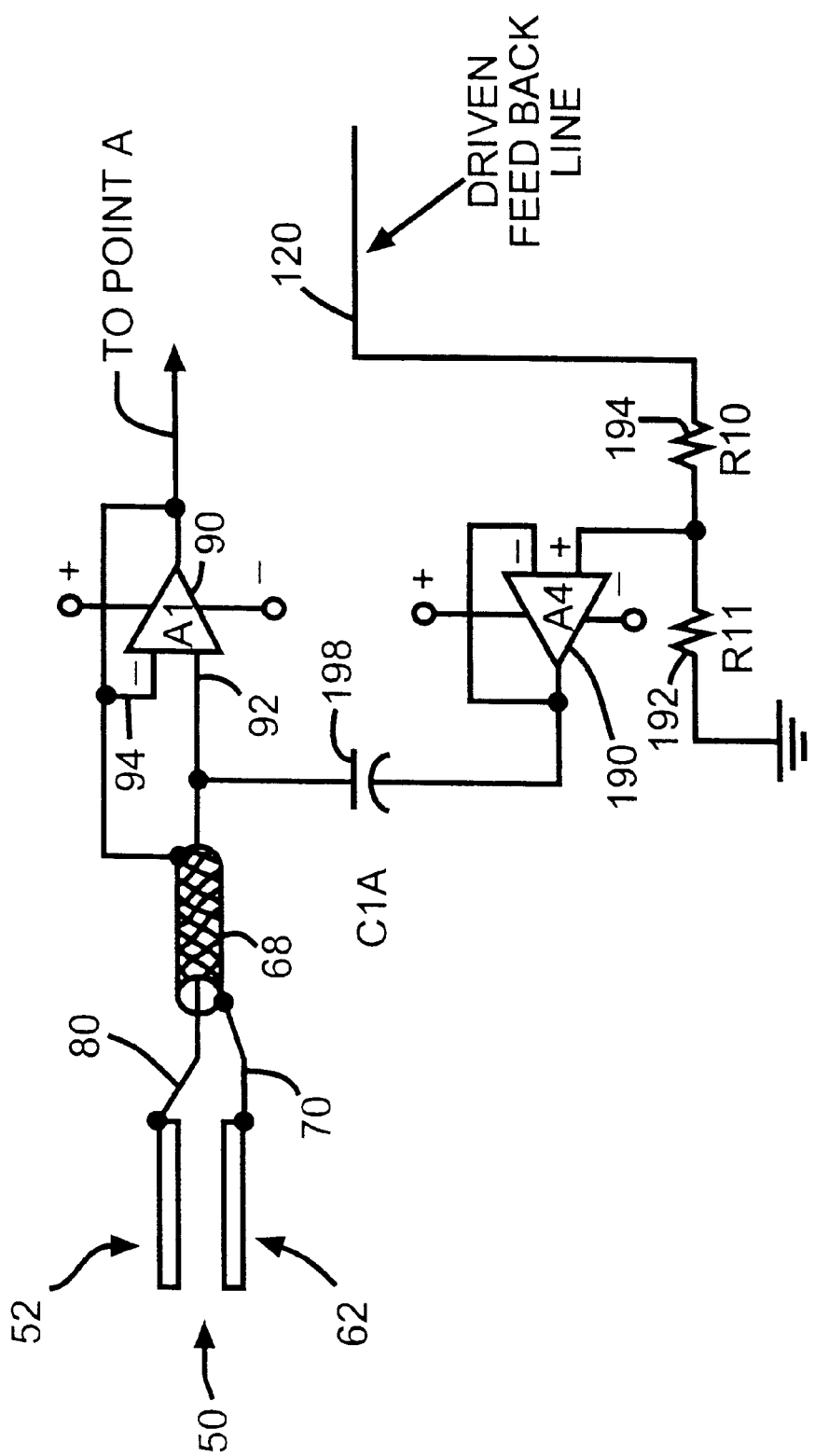
FIG. 9A is a schematic diagram of an embodiment of the monitor of the present invention which provides for reduction of capacitor voltage rating.

Shown in FIG. 9A is another embodiment of the invention whereby C1, the capacitor between the ion collecting plate 52 and ground reference, is connected to a circuit which will eliminate the necessity for a voltage rating for the C1 capacitor to be equal or greater than the limits of voltage appearing on the ion collecting surface 52. This is desirable due to the cost of low leakage capacitors which have a high voltage rating. Thus, instead of the capacitor being connected between ion collecting plate 52 and ground reference, the capacitor is connected between ion collecting plate 52 and an internal electrical reference which is provided by the circuit which now will be described. The circuit which provides for a reduction of voltage rating is shown in fragmentary form in FIG. 9A. Amplifier (A4), also designated 190, connected as an unity gain buffer amplifier, monitors the voltage at the resistive voltage divider of R10 and R11, also designated 192 and 194, respectively. The resistance ratio is chosen to reduce the voltage stress across capacitor C1A, also designated 198, by any desired ratio which is within the linear voltage operation of amplifier A4. For example, if the divider ratio is 100 to 1 by making R10, for example, 101 kilohms and R11 10 megohms, a divider ratio of 100 to 1 is produced. At this ratio, when the driven feedback line 120 rises to, for example, 1000 volts, in reference to ground reference, a negative 10 volt signal will appear at the output of the A4 buffer amplifier 190 in reference to the driven feedback line 120. As the voltage difference between the input to A1 amplifier/buffer 90 and the driven feedback line 120 is maintained at zero, as previously explained, a 10 volt charge will appear across capacitor C1A. Thus, where previously a 1000 volts level appeared across capacitor C1 in the foregoing embodiments for a voltage difference between the driven feedback line and ground reference of 1000 volts, now, in this embodiment, only 10 volts appears across capacitor C1A for the 1000 volt difference between driven feedback line and ground reference.

Both C1 and C1A must hold the same charge in reference to voltage changes occurring on the ion collecting surface 52. To do this, we need to multiply the value of C1A over the value of C1 by the same divider ratio of 100 to 1, as established by R11 and R10, thus making the value of C1A equal to 2,000 picofarads. With C1A at 2,000 picofarads (0.002 microfarads) the apparent capacitance as seen by the ion collecting surface 52 will be 20 picofarads as it was previously in the embodiment of FIGS. 4–8. As low leakage 0.002 microfarad capacitors having a 10 volt rating are of small size, and easily obtainable at low cost, the embodiment of FIG. 9A is preferred. The provision of buffer amplifier 190 prevents draining of the batteries in the circuit connected to driven feedback line 120.

In connection with the foregoing, the magnitude of the capacitance seen by the ion conducting surface 52, designated here by $C_s$, is obtained by the following relationship patterned after the relationship previously given in the description of FIG. 4:

$$C_s = C1A \left( 1 - 1 \Big/ \frac{R_{10} + R_{11}}{R_{11}} \right)$$

where the $$1 \Big/ \frac{R_{10} + R_{11}}{R_{11}}$$

term corresponds to A in the relationship between CD and Cp given in connection with the embodiment of FIG. 4.

Figure 9B:
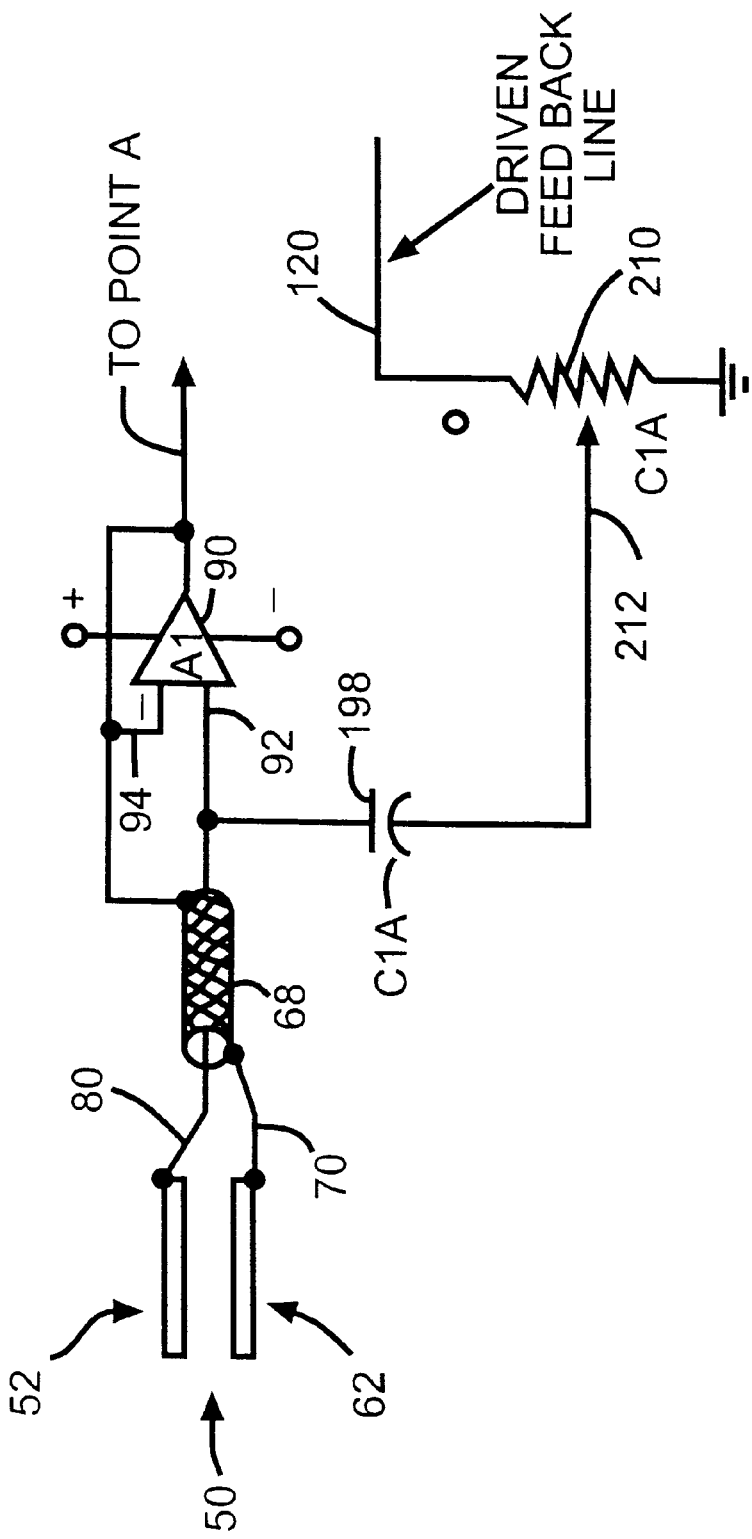
FIG. 9B is a schematic diagram of a basic form of the embodiment of FIG. 9A for varying the magnitude of the capacitance.

FIG. 9B illustrates a basic form of the embodiment of FIG. 9A wherein the value of capacitor C1A may be varied electrically. While current measurement standards specify 20 pf. as the value for the capacitance seen by ion conducting surface 52, there may be situations where it is desired to change that value. Resistors 192 and 194 are replaced by a potentiometer 210 connected between the driven feedback line 120 and ground reference. The wiper arm 212 of potentiometer 210 is connected to the one terminal of capacitor C1A, the other terminal of which is operatively connected to ion conducting surface 52 as in the embodiment of FIG. 9. The adjustable range of potentiometer 210 from zero resistance to maximum resistance varies the value of capacitor C1A seen by surface 52 from zero to the actual value of C1A as indicated in the diagram.

Figure 9C:
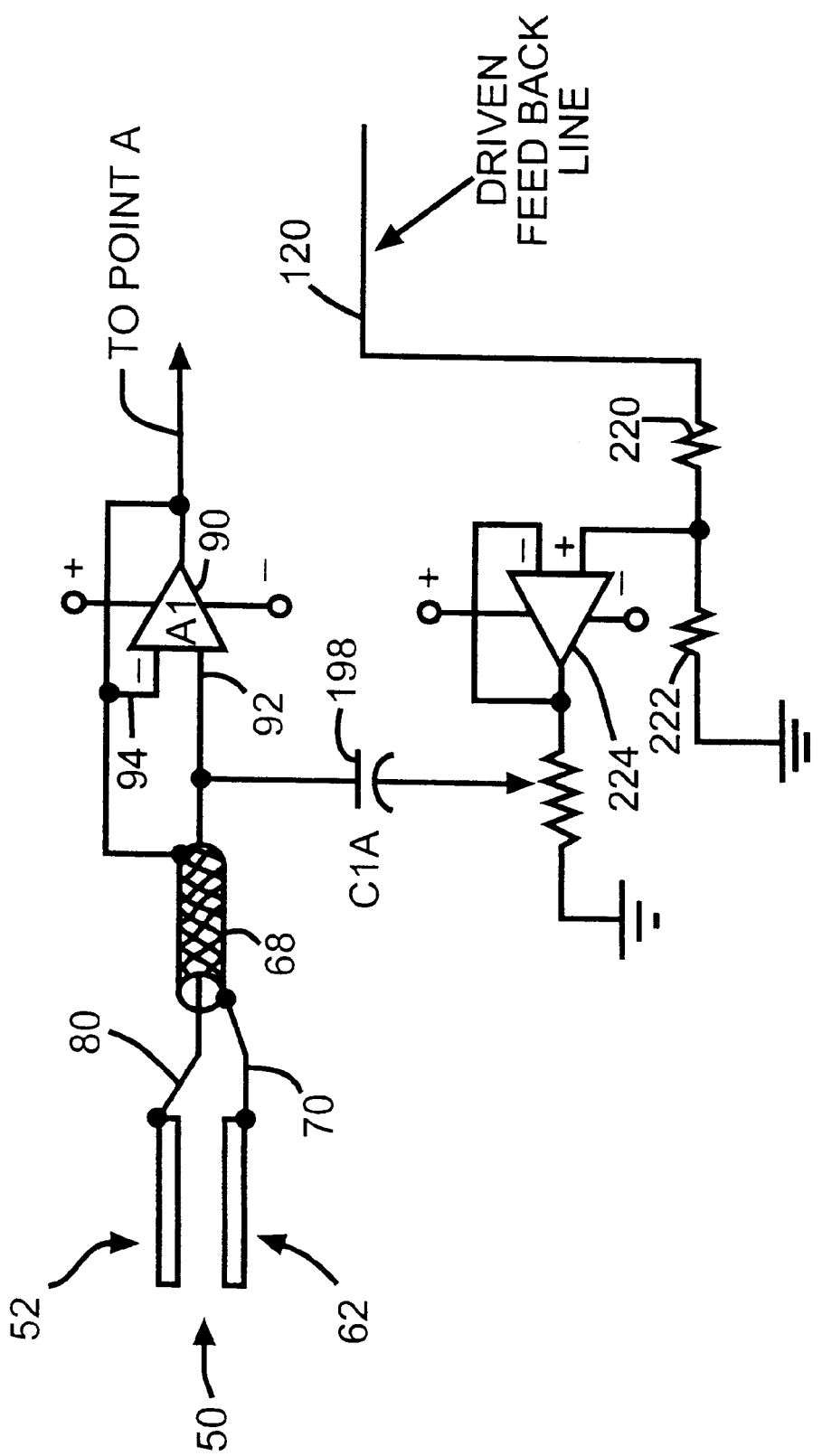
FIG. 9C is a schematic diagram of a preferred form of the embodiment of FIG. 9A for varying the magnitude of the capacitance.

FIG. 9C illustrates a preferred form of the embodiment of FIG. 9A for electrically varying the value of capacitor C1A. The series combination of resistors 220 and 222 is connected between driven feedback line 120 and ground reference. The junction of resistors 220, 222 is connected to the positive input of a buffer amplifier 224 similar to buffer amplifier 190 in the circuit of FIG. 9A. A potentiometer 226 is connected between the output of amplifier 224 and ground reference. The wiper arm 228 of potentiometer 226 is connected to the one terminal of capacitor C1A, the other terminal of which is operatively connected to ion conducting surface 52 as in the embodiment of FIG. 9A.

As in the embodiment of FIG. 9A, buffer amplifier 224 prevents draining of the batteries in the circuit connected to driven feedback line 120. Potentiometer 226 varies the value of capacitor C1A. Typical values in an illustrative circuit would be 100K for resistor 220, 1M for resistor 222 and 10K for the maximum value of potentiometer 226. In an illustrative apparatus, the wiper arm of potentiometer 226 would be controlled by a manually operated knob provided with a dial showing the range of adjustable values of capacitor C1A.

Potentiometer 226 can be replaced by a series combination of two resistors connected between the output of amplifier 224 and ground reference and with the junction of the two resistors connected to capacitor C1A. A digital to analog connector in combination with a microprocessor can be employed to change the ratio of the two resistors. Alternatively, potentiometer can be replaced by a digital potentiometer. In either event, the foregoing enables the value of capacitor C1A to be varied electrically by a computer operatively connected to the apparatus.

Figure 10:
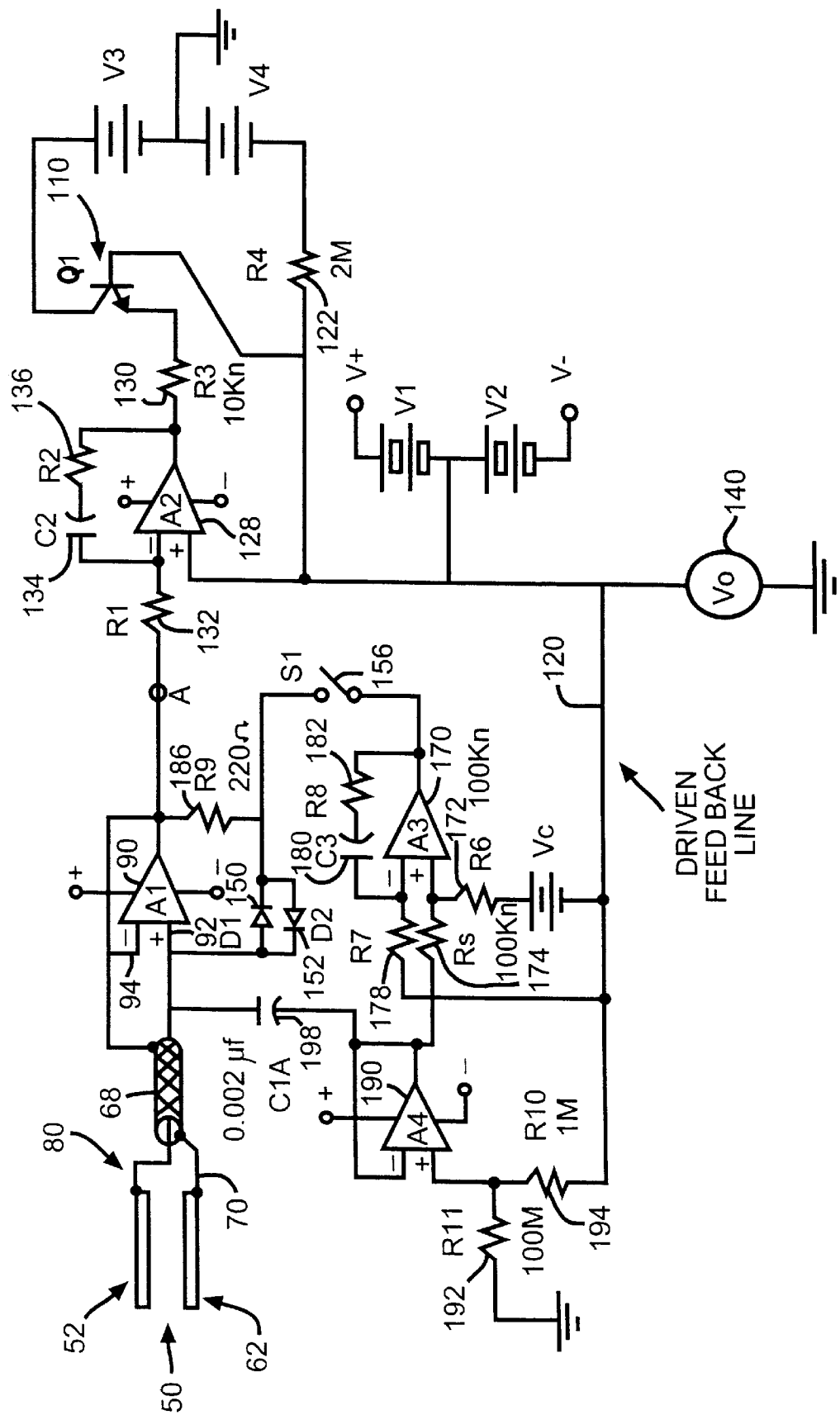
FIG. 10 is a schematic diagram of a monitor according to the present invention wherein the embodiments of FIGS. 7, 8 and 9 are combined.

As it will be apparent to those skilled in the art, the embodiments of FIGS. 7, 8, and 9 can be easily combined as shown in the embodiment of FIG. 10. The combination of the embodiments of FIGS. 7, 8, and 9 as shown in FIG. 10 provides a preferred embodiment. The resistance divider ratio as established by R5 and R6 in FIG. 7 when used in the embodiment of FIG. 10 can be reduced to a ratio of 1 to 1. This can be done because R5, shown connected to ground reference in FIG. 7, is returned to the output of A4 in FIG. 10. As amplifier A4 has a resistance ratio connected to its input of 100 to 1, the A4 output has a 100 to 1 ratio which can be used directly by the A3 circuitry.

It can also be easily seen that indicator Vo can be a D.C. responding device or A.C. responding device, or preferable both. Indicator Vo may also be connected to point A instead of the driven feedback line 120 because the voltage range enhancement circuitry A2 and Q1 drives the driven feedback line 120 to match the signals at point (A). Also the value of C1 or C1A may be different values than those indicated to provide an ion collecting surface 52 capacitance which is different than the 200 pf provided. The value of C1A may be varied electrically as previously described. Other variations may include the connection of the shield 68 to the driven feedback line 120 rather than to the output of amplifier/buffer (A1) because, here again, they are at the same signal level. If desired, for good protection of amplifier/buffer (A1), a pair of series connected opposing zener diodes or other protective devices may be connected between the junction point of the cathode of diode D1, anode of diode D2 and the driven feedback line 120.

As these embodiments do not employ an electrostatic probe device at the ion collecting plate assembly, the bandwidth of the monitor is not limited to a low frequency but extends to tens or hundreds of kilohertz depending on the components used, thus achieving high bandwidth capability, an objective of this invention.

In addition without the use of an electrostatic probe device and pre-charging relay or solenoid device, frequent cleaning and/or maintenance is not required, while reliability is enhanced due to the elimination of these mechanical devices.

When the monitor of the present invention is used in the decay mode, the ion collecting plate is pre-charged to a voltage level above a predetermined start voltage for a decay timer. The time required for the incident air ion flow to discharge the ion collecting plate from the predetermined start voltage to a predetermined stop voltage is measured by the monitor. When the monitor of the present invention is used in the float mode, the ion collecting plate initially is discharged to zero volts and then allowed to float to the voltage level dictated by incident air ion flow to the ion collecting plate.

The monitor of the present invention has the capability of including a computer interface whereby a serial communications port and an applications software program enable the monitor to be operated from a computer. This advantageously allows for automation of data collection and data storage, accumulation of statistical information, graphic display of the plate voltage in the time domain, report generation, higher resolution of the decay time and the ability to adjust the start and stop voltage set points in one volt increments. Ion balance tests and decay tests can be performed and run in a series to automate repetitive tests and data collection, and data can be acquired and displayed in graphical form to greatly enhance the interpretation of test results.

In particular, where the decay mode is selected, positive and negative decay tests can be performed to evaluate the ability of the ionizer to neutralize charges on surfaces in the work location. For each decay test, the decay waveform is observable and the decay time is given with ten millisecond resolution when the plate voltage reaches the programmed stop voltage. When the ion balance mode is selected, ion balance tests can be performed to evaluate the balance of positive and negative air ions. The test period can be of any specified length. The average, minimum and maximum plate voltages are recorded and displayed for each test period and the changes in plate voltage over time are graphed.

Computer operation of the monitor also enables a series of tests to be programmed and run. It is often necessary to repeat the same series of balance and decay tests on a number of ionizers and to record the test results. It is highly advantageous to automate this by the computer capability of the monitor of the present invention. This is accomplished by entering a test sequence mode to program and execute a series of test steps. The procedure is begun by building a series of ion balance and decay test steps. For each step, one specifies the test type (balance or decay) and then is prompted by the program to specify the parameters for each test step. Programming and running a test series is further enhanced with provisions for looping and for programming time delays between test steps. Editing a series of tests is done by identifying the test step to be edited whereupon the program gives a prompt to enter new parameters for that step. Unwanted test steps are deleted using a similar method.

All saved data is saved as tab-delineated text files that are easily opened using spreadsheet software. One is able to record additional notes with the test data. From there, one can manipulate the data as needed for analysis. Test data also can be retrieved and displayed within the applications program.

It is therefore apparent that the present invention accomplishes its intended objectives. While embodiments of the present invention have been described in detail, that is done for the purpose of illustration, not limitation.

What is claimed is:

1. A floating plate ion monitoring system comprising:
   a) an ion collector assembly comprising an ion conducting surface and a shielding surface on opposite sides of a sheet of insulating material, the ion conducting surface being located to receive ion impingement thereon; and
   b) a voltage follower circuit electrically connected to the ion conducting surface and to the shielding surface for applying to the shielding surface a potential which duplicates and follows the voltage appearing on the ion conducting surface;
   c) whereby the capacitance between the ion conducting surface and the shielding surface is established electrically and independent of the physical configuration of the ion collector assembly.

2. A floating plate ion monitoring system comprising:
   a) an ion collector assembly comprising an ion conducting surface and a shielding surface in spaced relation, the ion conducting surface being located to receive ion impingement thereon;
   b) a unity gain connected operational amplifier;
   c) means for connecting the ion conducting surface to the positive input of the amplifier;
   d) means for connecting the shielding surface to the inverting input of the amplifier;
   e) a capacitance connected between the ion conducting surface and a circuit for providing and establishing the magnitude of an internal electrical reference so that the voltage rating of the connected capacitance need not be equal to or greater than limits of voltage appearing on the ion conducting surface; and
   f) an indicator connected to the output of the amplifier;
   g) so that the capacitance between the ion conducting surface and the shielding surface is established by the connected capacitance and independent of the physical configuration of the ion collector assembly.

3. The monitoring system of claim 2, further including means operatively connected to the amplifier for expanding the voltage measuring range of the monitor.

4. The monitoring system of claim 3, wherein the voltage range expanding means comprises:
   a) a second operational amplifier having an inverting input coupled to the output of the first-named amplifier;
   b) a transistor switch connected to the output of the second operational amplifier; and
   c) a driven feedback line connected between the positive input of the second amplifier and the transistor switch.

5. The monitoring system according to claim 4, further including switch means between the first and second amplifiers for operation of the monitor in a decay mode.

6. The monitoring system according to claim 5, further including means operatively connected to said switch means for pre-charging the ion conducting surface.

7. The monitoring system of claim 3, wherein the circuit for providing internal electrical reference is operatively connected to the means for expanding the voltage measuring range of the monitor.

8. The monitoring system of claim 7, wherein the circuit includes a voltage divider for establishing a magnitude of the voltage reference.

9. The monitoring system of claim 8 further including a buffer amplifier connected between the voltage divider and the capacitor.

10. The monitoring system of claim 7, wherein the circuit includes a potentiometer for establishing an adjustable magnitude of the voltage reference.

11. The monitoring system of claim 2, wherein the circuit for providing the internal electrical reference includes a voltage divider for establishing a magnitude of the electrical reference.

12. The monitoring system of claim 11, wherein the circuit includes a potentiometer establishing an adjustable magnitude of the voltage reference.

13. A floating plate ion monitoring system comprising:
a) an ion collector assembly comprising an ion conducting surface and a shielding surface in spaced relation, the ion conducting surface being located to receive ion impingement thereon;
b) a unity gain connected operational amplifier;
c) means for connecting the ion conducting surface to the positive input of the amplifier;
d) means for connecting the shielding surface to the inverting input of the amplifier;
e) a capacitor having one terminal operatively connected to the ion conducting surface and having another terminal;
f) a network operatively connected to the amplifier for expanding the voltage measuring range of the monitor; and
g) a circuit operatively connected to said network and connected to the other terminal of said capacitor for providing an internal electrical reference;
h) so that the capacitance between the ion conducting surface and the shielding surface is established by the connected capacitor and independent of the physical configuration of the ion collector assembly and so that the voltage rating of the connected capacitor need not be equal to or greater than the limits of voltage appearing on the ion conducting surface.

14. The monitoring system according to claim 13, wherein the circuit includes a voltage divider for establishing a magnitude of the electrical reference and means for coupling the voltage divider to the other terminal of the capacitor.

15. The monitoring system according to claim 14, wherein the means for coupling comprises a buffer amplifier.

16. The monitoring system according to claim 15 further including a potentiometer operatively connected between said buffer amplifier and said capacitor for establishing an adjustable magnitude of the voltage reference.

17. The monitoring system according to claim 13, wherein the circuit includes a potentiometer for establishing an adjustable magnitude of the voltage reference.

18. A floating plate ion monitoring method comprising:
a) providing an ion collector assembly comprising an ion conducting surface and a shielding surface in spaced relation, the ion conducting surface being located to receive ion impingement thereon;
b) applying to the shielding surface a potential which duplicates and follows the voltage appearing on the ion conducting surface;
c) connecting a capacitance to the ion conducting surface to establish electrically the capacitance between the ion conducting surface and the shielding surface and independent of the physical configuration of the ion collector assembly; and
d) applying a voltage reference to the connected capacitance so that the voltage rating thereof need not be equal to or greater than the limits of voltage appearing on the ion conducting surface.

19. The method according to claim 18 further including varying the magnitude of the connected capacitance.

20. The method according to claim 18 further including varying the magnitude of the applied voltage reference in a manner varying the magnitude of the connected capacitance.

* * * * *